United States Patent [19]
Heaton

[11] Patent Number: 5,463,359
[45] Date of Patent: Oct. 31, 1995

[54] IMPEDANCE MATCHING NETWORK FOR LOW OUTPUT IMPEDANCE DEVICES

[75] Inventor: Dale A. Heaton, Garland, Tex.

[73] Assignee: Texas Instruments Incorporated, Dallas, Tex.

[21] Appl. No.: 215,561

[22] Filed: Mar. 21, 1994

[51] Int. Cl.⁶ .................................................. H03H 7/38
[52] U.S. Cl. ...................... 333/32; 327/334; 333/22 R
[58] Field of Search .................................. 333/22 R, 32; 307/490, 540, 542; 327/309, 310, 334

[56] References Cited

U.S. PATENT DOCUMENTS 5,086,271  2/1992  Haill et al. ................... 333/22 R X
5,164,663  11/1992  Alcorn ......................... 333/22 R X
5,287,022  2/1994  Wilsher ........................ 333/22 R x

*Primary Examiner*—Paul Gensler
*Attorney, Agent, or Firm*—Mark E. Courtney; W. James Brady, III; Richard L. Donaldson

[57] ABSTRACT

An impedance matching circuit which includes an RC network placed at the end of the transmission line and which will absorb reflections. The values of the resistor and capacitor are selected such that the output voltage at the end of the transmission line is attenuated only during the duration of the reflected waves and the overall gain from the incident signal to the end of the transmission line is 1:1. The values of the resistor and capacitor selected are based upon the impedance mismatch and the length of the transmission line.

2 Claims, 1 Drawing Sheet

IMPEDANCE MATCHING NETWORK FOR LOW OUTPUT IMPEDANCE DEVICES

BACKGROUND OF THE INVENTION

1. Field of the Invention

This invention relates to a circuit for impedance matching for testing devices for low output impedance devices, particularly CMOS devices.

2. Brief Description of the Prior Art

Integrated circuit devices which have a lower output impedance than the transmission line (e.g., stripline, microstrip, coaxial line, etc.) which the integrated circuit device is driving will cause the output waveform to oscillate due to reflections of the incident waveform. The time required for this oscillation to dampen is dependent upon the electrical length of the transmission line.

Terminating the transmission line at the end of the line with an equivalent matching resistor is not an optimum solution. CMOS integrated circuits typically have substantially less than 50 ohms output impedance. The typical transmission line is 50 to 100 ohms. CMOS devices have evolved into low power high speed logic devices. Therefore, the addition of a 50 ohm to 100 ohm termination resistor at the end of the transmission line on all outputs would significantly increase the power dissipation, thereby defeating a key advantage for using CMOS (low power consumption).

By adding a resistor in series with the device output (between the device and the transmission line) to match the transmission line impedance, the reflections that cause the oscillation will be eliminated. However, this series termination of the outputs of CMOS devices reduces the high logic level output current (IOH) and low logic level output current (IOL) which the CMOS device can drive. The output impedances of these CMOS logic devices are deliberately low in order to drive high IOH and IOL currents.

Known prior art CMOS testing devices include the Teradyne J971 which has diodes and programmable voltages to clamp the reflections at the nominal output voltage levels. There are several problems associated with this method. One problem is that, in order to clamp the voltage at the nominal levels, the diode must have a significant idle current supplied by the device under test (DUT) output in the static state. Further, though the voltage levels are clamped at the nominal output voltages, there is still significant stray transient current (about 40 ma) while the DUT is switching to the next state. This stray transient current can cause timing skews and affect the output waveform edges at the end of the transmission line.

The Trillium Tester switches a 50 ohm termination resistor dynamically to terminate the 50 ohm transmission line. This 50 ohm termination attenuates the DUT output. Then the comparator levels must be adjusted based upon the attenuation ratio. Also, the switching spikes caused by dynamically switching the termination resistors is not desirable.

None of the above described test methods recreate the way the CMOS device is used in the final application.

It is common practice to place a 50 ohm ohm termination resistor in series with a large capacitor at the end of the transmission line. This method attenuates the DUT output based upon the ratio of the output resistance of the DUT and the 50 ohm termination. Then there is a large RC time constant required for the DUT output to reach the nominal voltage level between states. The method causes timing skews and affects the output waveform edges at the end of the transmission line based upon the large RC time constant.

SUMMARY OF THE INVENTION

In accordance with the present invention, the above noted problem of the prior art is minimized and there is provided an impedance matching circuit which absorbs the reflections and does not increase DC power dissipation or reduce IOH or IOL of the device output. This impedance matching circuit impedance (ZT), comprised of a resistor and capacitor, is chosen to provide an overall voltage gain of 1 from the incident output signal $V_{inc}$ from the DUT to the signal at the end of the transmission line $V_{end}$ as shown in FIG. 1. Also, the RC time constant of the impedance matching circuit is chosen to be proportional to the electrical length of the transmission line such that only the reflected waves are attenuated. This reduces the residual affects of the RC network.

The reflections are caused by the mismatch in output impedance of the integrated circuit device (DUT) and the transmission line impedance. An RC network placed at the end of the transmission line will absorb these reflections. As stated above, the values of the resistor and capacitor are selected such that the signal at the end of the transmission line is attenuated over the duration of the reflected waves where the overall gain from the incident signal to the end of the transmission line is 1:1. The values of the resistor and capacitor selected are based upon the impedance mismatch and the length of the transmission line.

DESCRIPTION OF THE PREFERRED EMBODIMENT

Figure 1:
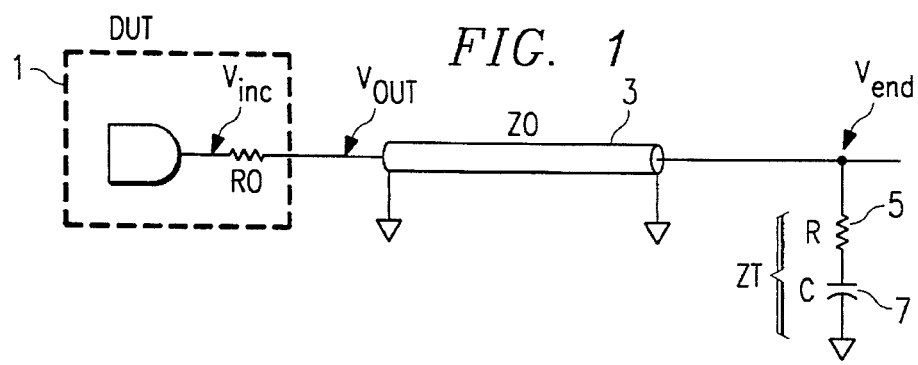
FIG. 1 is a circuit diagram of an impedance matching network in accordance with the present invention.

Referring now to FIG. 1, there is shown a circuit of a device under test (DUT) feeding into an impedance matching network in accordance with the present invention. The circuit includes a device under test (DUT) 1 which, in the preferred embodiment is a CMOS integrated circuit having an output resistance RO and an incident signal voltage $V_{inc}$. The output signal voltage $V_{out}$ of the DUT 1 is connected to a transmission line 3 having an impedance ZO. The transmission line is terminated by an RC circuit noted as ZT and having a resistor 5 and a capacitor 7. The signal voltage at the end of the transmission line 3 is $V_{end}$. An essential inventive feature herein is the determination of the values to be given to the RC circuit composed of the resistor 5 and the capacitor 7 and the manner of such determination.

The attenuation from the incident signal $V_{inc}$ to the output $V_{out}$ of the device under test (DUT) 1 is:

$$V_{out} = (V_{inc} * ZO)/(ZO + RO) \tag{1}$$

The gain from the DUT output $V_{out}$ to the end of the transmission line $V_{end}$ is:

$$V_{end} = 2 * V_{out} \cdot ZT/(ZO + ZT). \tag{2}$$

By solving the above equations for $V_{out}$, the following equality is derived:

$$V_{out} = V_{inc} * ZO/(ZO+RO) = V_{end}*(ZO+ZT)/(2*ZT) \quad (3)$$

from which is derived with an overall gain of $1 = V_{end}/V_{inc}$:

$$ZT = ZO(ZO+RO)/(ZO-RO) \quad (4)$$

The RC time constant necessary to absorb the reflection is based upon the time delay of the transmission line and the ratio of the mismatch in impedance. The greater the mismatch, the greater the time constants required to absorb the reflection. It follows that:

$$(ZO/RO)*T_{delay} = R*C \quad (5)$$

where $T_{delay}$ is the delay in nanoseconds (ns) in signal propagation through the transmission line due to the length of the transmission line.

The impedance ZT is determined by the equation:

$$ZT = R + 1/Cs \text{ where } s = 2*3.1416*F_t, \text{ where } F_t \text{ is the highest frequency component of the incident voltage } V_{inc} \text{ and } F_t \text{ is in megahertz (MHz)} \quad (6)$$

The frequency $F_t$ is determined by the rise time (tr) of the incident voltage $V_{inc}$ from the DUT in accordance with the equation:

$$F_t = (1/tr)*0.35. \quad (7)$$

For example, for a 1 nanosecond tr the highest frequency component ($F_t$) is 350 ohm MHz. This frequency $F_t$ is not a significant part of the RC calculation. Any frequency $F_t$ from 300 MHz to 1 gigahertz does not significantly change the RC values calculated.

By combining equations (5) and (6) above:

$$C = (ZO*T_{delay})/(ZT*RO) + 1/2*3.1416*F_t*ZT, \text{ where C is in picofarads (pf).} \quad (8)$$

From equations (4), (6) and (8), the values of R and C are determined based upon the mismatch in impedance of the DUT output RO and the transmission line (ZO) and electrical length of the transmission line ($T_{delay}$).

EXAMPLE

As an example, for a CMOS device with an output resistance of 10 ohms and driving a 50 ohm ohm transmission line of 0.9 nanoseconds time delay (6 inches of strip line), the termination resistor and capacitor (RC) can be calculated from equations (4) and (5) as follows:

$$ZT = ZO(ZO+RO)/(ZO-RO) = 50(50+10)/(50-10) = 75 \text{ ohms.}$$

$$C = (ZO * T_{delay})/(ZT * RO) + 1/(2 * 3.1416 * \text{frequency} * ZT)$$

$$C = (50 * 0.9 \text{ ns})/(75 * 10) + 1/(2*3.1416 * 50 \text{ MHz} * 75) = 64.2 \text{ pf.}$$

$$R = ZT - 1/Cs \text{ where } s = 2 * 3.1416 * \text{frequency}$$

$$R = 75 - 1/(64.2 \text{ pf} * 2 * 3.1416 * 50 \text{ MHz}) = 70 \text{ ohms.}$$

Figure 2:
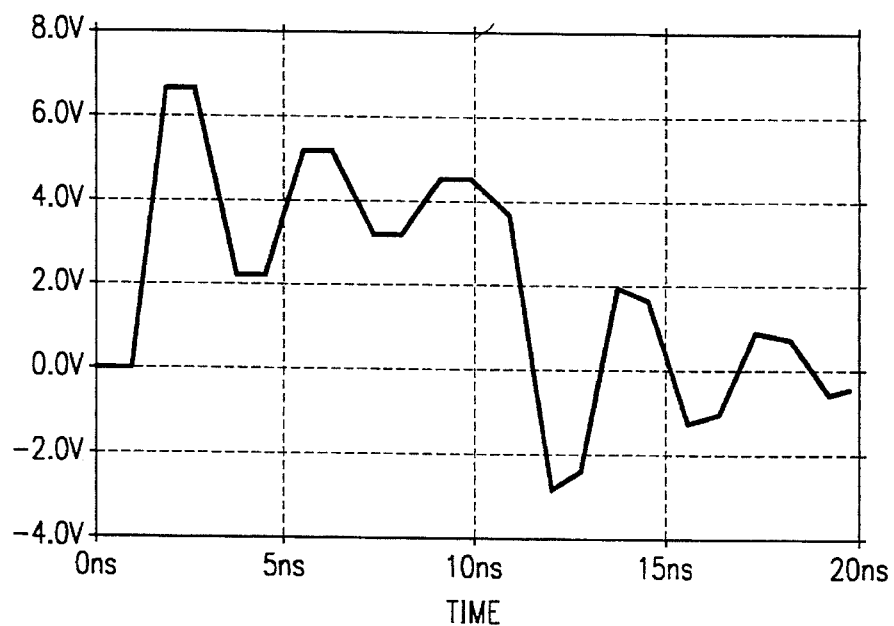
FIG. 2 is a SPICE simulation waveform of the example of the preferred embodiment without the matching RC network.
Figure 3:
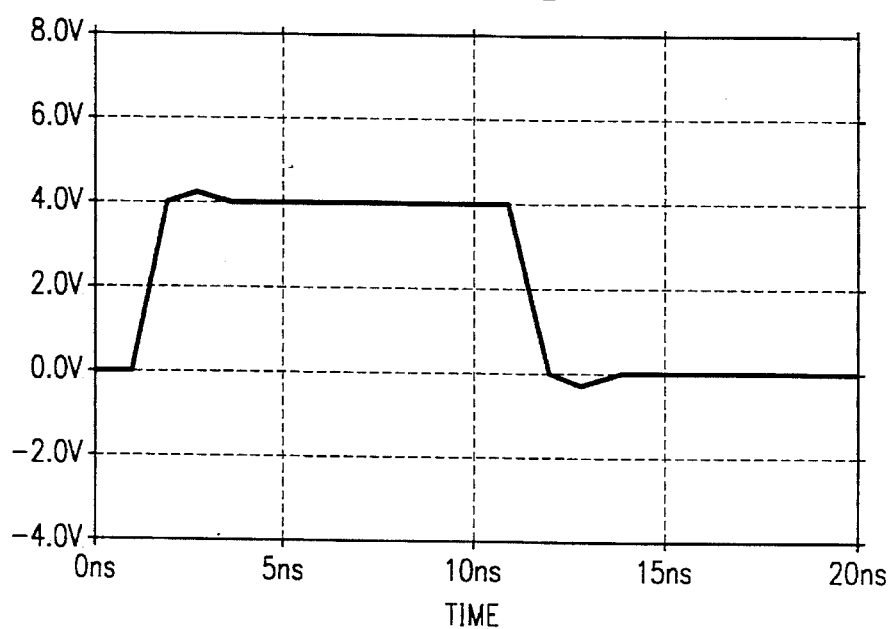
FIG. 3 is a SPICE simulation waveform of the example of the preferred embodiment with the matching RC network.

FIG. 2 is a SPICE simulating waveform of the above example without the matching RC network and FIG. 3 is a SPICE simulation waveform of the above example with the matching RC network.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. An impedance matching circuit for matching a low output impedance device to a relatively higher impedance transmission line comprising:

(a) a transmission line connected to the output of a low output impedance device, said device having a lower output impedance than the impedance of said transmission line; and (b) a resistor-capacitor termination, where the said resistor and capacitor are connected in series, terminating said transmission line, the values of said resistor and capacitor being determined by the equations:

(i) $ZT = ZO(ZO+RO)/(ZO-RO)$, where ZT is the impedance due to the series combination of said resistor and said capacitor, ZO is the impedance in ohms of said transmission line and RO is the output impedance in ohms of said low output impedance device, (ii) $C = (ZO * T_{delay})/(ZT * RO + 1/(2 * 3.1416 * F_t * ZT)$, where $T_{delay}$ is the delay in nanoseconds of the time for a wave to travel through said transmission line and $F_t$ is the highest frequency component in megahertz of the wave travelling through said line and C is the capacitance of said capacitor in picofarads; and (iii) $R = ZT - 1/Cs$ where $s = 2 * 3.1416 * F_t$, where R is the resistance of said resistor in ohms.

2. The circuit of claim 1 wherein said low output impedance device is a CMOS integrated circuit.

* * * * *

UNITED STATES PATENT AND TRADEMARK OFFICE
CERTIFICATE OF CORRECTION

PATENT NO. : 5,463,359

DATED : October 31, 1995

INVENTOR(S) : Dale A. Heaton.

It is certified that error appears in the above-indentified patent and that said Letters Patent is hereby corrected as shown below:

Col. 1, line 62, delete "ohm" (second occurrence).

Col. 3, line 15, in equation (5), change " $_{deLay}$ " to -- $_{delay}$ --.

Col. 3, line 38, in equation (8), change "1/2*3.1416*$F_t$*ZT" to --1/(2*3.1416*$F_t$*ZT)--.

Col. 4, line 40, in Claim 1, change "(ZT * RO" to --(ZT * RO)--.

Signed and Sealed this

Twenty-seventh Day of August, 1996

Attest:

BRUCE LEHMAN

Attesting Officer        Commissioner of Patents and Trademarks